(12) United States Patent
Jiang

(10) Patent No.: US 6,524,891 B1
(45) Date of Patent: Feb. 25, 2003

(54) METHOD OF PRESSURE CURING FOR REDUCING VOIDS IN A DIE ATTACH BONDLINE AND APPLICATIONS THEREOF

(75) Inventor: Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/515,579

(22) Filed: Feb. 29, 2000

(51) Int. Cl.⁷ .............................................. H01L 21/44
(52) U.S. Cl. ........................... 438/118; 438/15; 438/25; 438/51; 438/64; 438/106
(58) Field of Search ......................................... 438/118

(56) References Cited

U.S. PATENT DOCUMENTS

| | | | |
|---|---|---|---|
| 5,086,018 A | 2/1992 | Conru et al. ................ 437/207 |
| 5,177,032 A * | 1/1993 | Fogal et al. ................ 437/220 |
| 5,221,642 A * | 6/1993 | Burns ......................... 437/207 |
| 5,654,877 A | 8/1997 | Burns ......................... 361/713 |
| 5,834,339 A | 11/1998 | Distefano et al. ........... 438/125 |
| 5,849,607 A | 12/1998 | Seo et al. ................... 438/114 |
| 6,087,006 A * | 7/2000 | Tanaka et al. ........... 428/411.1 |

* cited by examiner

*Primary Examiner*—Olik Chaudhuri
*Assistant Examiner*—Wai-Sing Louie
(74) *Attorney, Agent, or Firm*—Dorsey & Whitney LLP

(57) ABSTRACT

A method of curing adhesives of a die attach material to reduce the formation of voids at the resulting bondline, defined by the interface between the adhesive and the surface of a die being attached. The method includes applying a relatively high pressure, in addition to a relatively high temperature, to cure the adhesive material.

20 Claims, 2 Drawing Sheets

METHOD OF PRESSURE CURING FOR REDUCING VOIDS IN A DIE ATTACH BONDLINE AND APPLICATIONS THEREOF

TECHNICAL FIELD

The present invention relates to semiconductor device packaging, and more particularly, to curing adhesive material affixing a semiconductor die in a device package.

BACKGROUND OF THE INVENTION

Integrated circuit devices are typically fabricated on thin wafers of silicon. Several die are produced on each wafer, with each die representing a single integrated circuit device. Each integrated circuit device on a wafer is tested for gross functionality, and sorted according to whether the device passes or fails the gross functionality test. After being sorted according to gross functionality, the wafers are cut using a wafer saw, and the individual die are singulated. The die having devices determined to be non-functional are scrapped. The die having functional devices are packaged and further tested to ensure that each packaged device satisfies a minimum level of performance. Typically, the functional devices are permanently packaged by encapsulating the die in a plastic package. Packaging of the functional devices facilitates handling of the devices and also protects the die from damage during the manufacture of modules using the packaged devices.

There are several conventional structures and methods for packaging singulated die. For example, more common package types include small outline j-bend (SOJ) packages, thin small outline packages (TSOP), and zigzag in-line packages (ZIP). The finished packaged devices are often mounted onto a substrate as part of a module. Singulated die are packaged in the aforementioned package types typically by attaching the die to a lead frame paddle and electrically coupling exposed bond pads of the die to metal leads. The lead frame, die, and a portion of the metal leads are subsequently encapsulated by a plastic resin to protect the integrated circuit from damage. The encapsulated device is then trimmed from the lead frame and the metal leads formed to the correct bend.

An alternative lead frame structure, known as lead on chip (LOC) has been employed instead of the package structure having a lead frame paddle. In an LOC structure, individual metal leads are typically attached to the surface of the die using double-sided adhesive tape having a polyimide base coated on both sides with adhesive material. The metal leads and die are then heated to cure the adhesive material. The bond pads of the semiconductor die are subsequently wire bonded to a respective metal lead. The LOC lead frame and die are then encapsulated in a plastic resin, then followed by a trim and form process. The LOC structure and packaging process are described in U.S. Pat. No. 4,862,245 to Pashby et al., issued Aug. 29, 1989, and U.S. Pat. No. 4,916,519 to Ward, issued Apr. 10, 1990, which are incorporated herein by reference.

Recently, semiconductor manufacturers have developed a package structure where unpackaged die are mounted directly onto a substrate, for example, a printed circuit board, thus allowing modules to be designed with increased device density. The devices are mounted onto the substrate and are electrically coupled by wire bonding the bond pads of the die to conductive traces formed on the surface of the substrate. The die are typically attached to the substrate by using strips of single or double-sided adhesive tape that are sandwiched between the substrate and the die. Following attachment, the substrate and die are heated to cure the adhesive in order to firmly fix the die.

As described above, many of the current methods of packaging semiconductor die involved attaching the die to a lead frame or a substrate using a single or double-sided adhesive tape. As mentioned previously, the adhesive tape is typically formed from a heat resistant polyimide base coated on both sides with adhesive material. In order to firmly attach the semiconductor die, the adhesive is cured by heating. A typical example of the temperature profile of the curing process is: 5° C./min. ramp from room temperature to 110° C.; one hour soak; 5° C./min. ramp from 110° C. to 165° C.; one hour soak; −5° C./min ramp from 165° C. back down to room temperature.

A problem with the conventional temperature cure processes is that it is time-consuming, and oftentimes, voids are created in the die attach bondline. The die attach bondline is defined as the interface between the surface of the die and the adhesive. In the ideal case, there would be no voids in the adhesive, so that the entire area of the die in contact with the adhesive would be flush with the adhesive. However, voids are formed at the interface between die and adhesive during the temperature cure process for various reasons. For example, voids are often formed during the cure step because moisture absorbed by the polyimide base evaporates during the relatively high temperature cure process. The evaporated moisture causes bubbles to form in the adhesive. Consequently, after the adhesive has been fully cured, voids resulting from the bubbles being trapped at the interface between the die surface and the adhesive material remain in the die attached bondline.

Voids in the die attach bondline may be further caused by incomplete wetting spots in the adhesive prior to the cure process, residual solvents out-gassing from the adhesive during the temperature cure, or by unreacted organic material in the adhesive.

The voids generated during the relatively high temperature cure step degrade the reliability of the resulting semiconductor device package. One potential failure mechanism results when gases trapped in the voids formed along the die attach bondline quickly expand when subjected to a thermal reflow process during the mounting of the packaged device onto a printed circuit board. In the worst case, the rapid expansion of the gases within the voids will cause the semiconductor die to delaminate from the adhesive. Consequently, where the semiconductor die is encapsulated in a plastic resin, separation of the die from the adhesive may cause the plastic package to crack, compromising the integrity of the integrated circuit device. Therefore, there is a need for a method of attaching a die to a substrate where the formation of voids at the interface between the adhesive and the die surface is reduced.

SUMMARY OF THE INVENTION

The present invention is directed to a method of curing adhesives of a die attach material to reduce the formation of voids at the resulting bondline. The resulting bondline, defined by the interface between the adhesive and the surface of a die being attached, will have less voids than with the conventional curing process. The method includes applying a relatively high pressure, in addition to a relatively high temperature, to cure the adhesive material.

DETAILED DESCRIPTION OF THE INVENTION

As mentioned previously, voids in a die attach bondline are often created during the curing process of adhesives affixing a semiconductor die. Embodiments of the present invention apply a relatively high pressure, in addition to the increased temperature, to cure the adhesives. The resulting die attach bondline has less voids than one cured using the conventional temperature curing process.

Figure 1:
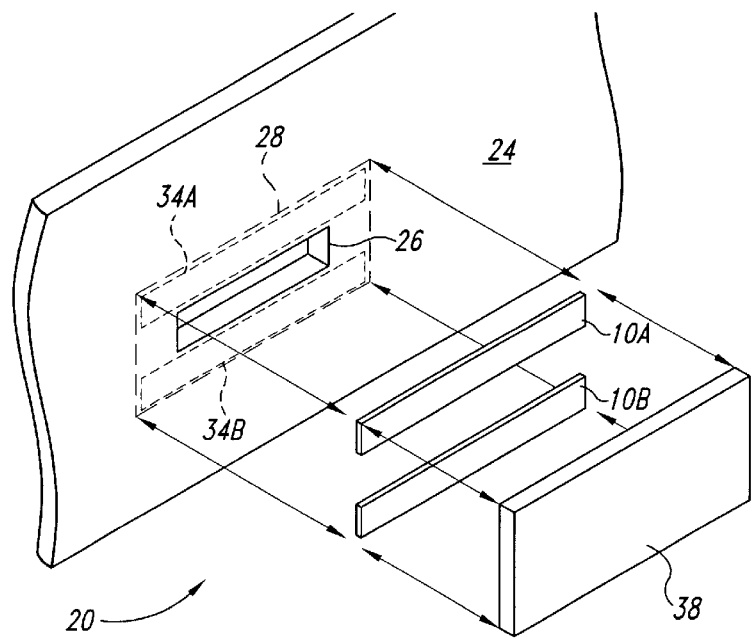
FIG. 1 is an exploded isometric view of a Board On Chip (BOC) type package structure.

FIG. 1 illustrates an example of an application of the adhesive material in a Board On Chip ("BOC") type package 20. A semiconductor die 38 is attached to a substrate 24 in a position represented by outline 28. The substrate 24 may be a rigid organic substrate, such as BT resin, or FR-4 or FR-5 material, or a flexible substrate, such as polyimide. A person of ordinary skill in the art will appreciate that the substrate 24 may formed from materials other than those provided herein. Consequently, the type of material used for the substrate 24 does not limit the scope of the present invention. The substrate 24 has an opening 26 through the substrate which exposes a portion of the semiconductor die 38 when positioned according to the outline 28. Strips of adhesive tape 10a and 10b are adhered to the surface of the substrate 24 adjacent to the opening 26, as indicated by outlines 34a and 34b, respectively. The adhesive tape has adhesive material laminated or coated to both sides of a thermally resistant polyimide base. A singulated semiconductor integrated circuit, or die 38, is positioned with respect to the substrate 24 as shown in FIG. 1, and attached to the substrate 24 by pressing the die 38 against the strips of adhesive tape 10a and 10b. The surface of the die 38 contacting the strips of adhesive tape 10a and 10b typically has a protective layer of polyimide or SiON to prevent the device from being damaged during the die singulating process or the die attachment process. Consequently, the die 38 will not be damaged when attached to the substrate 24.

Following attachment of the die to the substrate 24, the adhesives of the die attach tape 10a and 10b are cured using a process that includes both a relatively high pressure and increased temperature. Embodiments of the curing processes according to the present invention may be performed in an autoclave device having both adjustable pressure and temperature conditions. Such an autoclave device is well-known in the art and will not be described in detail herein.

A range of pressures operable to enable embodiments of the present invention include 30 p.s.i. to 250 p.s.i. Similarly, a range of operable temperatures include 100° C. to 200° C. Typically, embodiments of the present invention are carried out within a pressure range between 115 p.s.i. and 135 p.s.i., and a temperature range between 140° C. and 175° C. In a particular embodiment, the curing process takes place at 125 p.s.i. and 165° C. The length of time that the BOC structure is subjected to the relatively high pressure and temperature may range from 30 minutes to 4 hours. More typically, the BOC structure remains at 125 p.s.i. and 165° C. for 70 minutes. As a person of ordinary skill in the art will appreciate, the optimum pressure, temperature, and time will depend on the type of package structure and the specific type of adhesive materials used to attach the die.

Another factor that affects the length of time a package structure is subjected to the relatively high pressure and temperature is the rate at which the autoclave device ramps up to the curing process conditions and ramps down to room temperature and pressure. Generally, the length of time the package structure remains at the relatively high pressure and temperature is measured from when the pressure and temperature conditions of the autoclave have been reached.

In the case where the die attach tape is RP444-3 tri-layer epoxy film manufactured by Ablestik Laboratory, the number of voids in the die attach bondline is reduced, with respect to a conventionally cured bondline, when the adhesives is cured at 125 p.s.i. and 165° C. for 70 minutes. That is, the package structure is soaked for 70 minutes after the specific pressure and temperature have been reached. These values are provided. as a non-limiting example of a typical embodiment in accordance with the present invention, and is not intended to limit the scope of the present invention.

After the adhesives are cured, the die 38 is electrically connected to the substrate 24 by wire bonding the bond pads of the die 38 to electrically conductive traces formed on the surface of the substrate 24 opposite of the one to which the die 38 is attached. The die 38 has bond pads formed essentially along its longitudinal axis that are exposed through the protective layer of polyimide or SiON. When the die 38 is mounted onto the substrate 24, the bond pads will remain exposed through the opening 26. The bond wires extend from the bond pads of the die 38, through the opening 26, and to the surface of the substrate 24. The conductive traces to which the bond pads are connected may be further connected to other devices also attached to the substrate. In the case of a BOC type ball grid array ("BGA") package, the conductive traces are connected to a respective solder ball which are used to electrically connect the finished packaged device to a printed circuit board, or the like.

A person of ordinary skill in the art will appreciate that additional steps are required to complete the packaged device. For example, the die 38 and the bond wires electrically connecting the bond pads to the conductive traces will eventually need to be encapsulated to protect the device from damage, and to ensure its reliability. However, completing such a device is well known in the art, and such additional steps will not be discussed in detail herein in the interest of brevity.

Figures 2A, 2B:
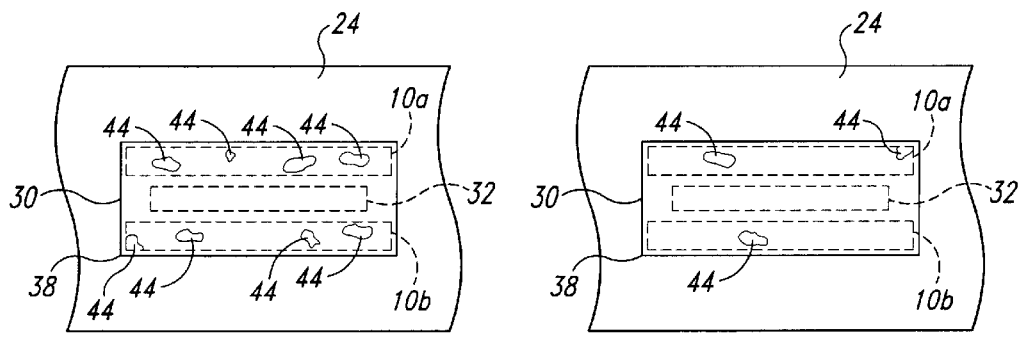
FIGS. 2A–B are plan views of BOC package structures having the adhesive material cured according to an embodiment of the present invention and the conventional process, respectively.

FIG. 2A illustrates a plan view of a BOC type package where the die 38 has been attached to the substrate 24 using the conventional temperature curing process. The die attach bondline, that is, the interface between the adhesive material of the strips of adhesive tape 10a and 10b, and the surface of the die 38, is illustrated as having several voids 44. As mentioned previously, the voids 44 may be caused by several reasons, including evaporation of moisture absorbed by the polyimide base. The voids 44 may eventually compromise the reliability of the packaged device.

In contrast, FIG. 2B illustrates a plan view a BOC type package where the die 38 has been attached to the substrate 24 using a curing process according to principles of the present invention. The number of voids 44 in the die attach bondline has been substantially reduced. Application of a relatively high pressure, in addition to the relatively high temperature, increases the boiling temperature of residual moisture of solvent. The increased boiling temperature prevents dramatic vaporization of the residual moisture or solvent. Consequently, the volatile will diffuse through the adhesive material of the strips of adhesive tape 10a, 10b instead of causing voids in the die attach bondline.

Figure 3:
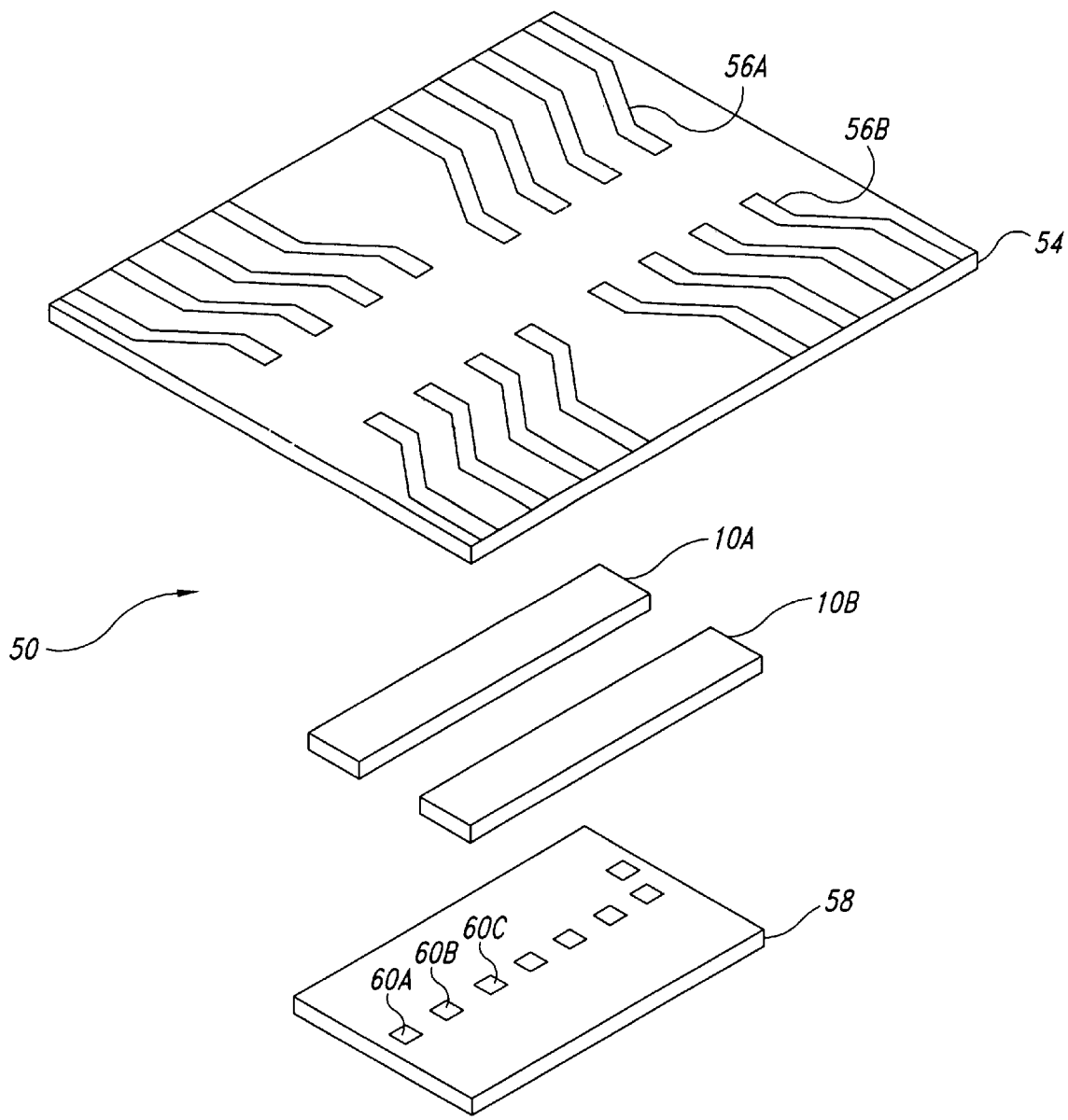
FIG. 3 is an exploded isometric view of a Lead On Chip (LOC) type package structure.

Shown in FIG. 3 is another example of a package structure where the curing processes according to the present invention may be used to cure the adhesives of the package structure. As mentioned previously, a packaged semiconductor device may be formed using a Lead On Chip ("LOC") type structure 50. A lead frame 54 is formed having lead fingers 56a and 56b to which a die 58 is attached and electrically bonded through bond wires. Strips of adhesive tape 10a and 10b are adhered to the surface of the lead fingers 56a and 56b, respectively. Typically, the lead frame 54 comes formed in strips having several lead frames, and having strips of adhesive tape 10a and 10b pre-attached to the lead fingers 56a and 56b in order to facilitate the die attach process. However, additional lead frames have been omitted from FIG. 3 to simplify the explanation of the LOC type structure 50.

The die 58 is formed with bond pads 60a–c located substantially along the longitudinal axis of the die 58. The die 58 is attached to the lead frame 54 by pressing the die 58 against the lead frame 54 and the strips of adhesive tape 10a and 10b. The adhesive material of the strips of adhesive tape 10a and 10b, are cured to firmly attach the die 58 to the lead frame 54. A curing process similar to that described with respect to the BOC structure of FIG. 1 may be used to reduce the voids in the die attach bondline in the LOC structure shown in FIG. 3. That is, a curing process incorporating both a relatively high pressure and increased temperature.

For example, the LOC structure may be subjected to pressures ranging from 30 p.s.i. to 250 p.s.i., and temperatures ranging from 100° C. to 200° C. in order to cure the adhesive material of the strips of adhesive tape 10a and 10b. As mentioned previously, an autoclave device having adjustable pressure and temperature conditions that accommodates the pressure and temperature ranges is well-known in the art. The length of time that the LOC structure is subjected to the relatively high pressure and temperature ranges from 30 minutes to 4 hours. The optimum pressure, temperature, and time conditions for curing the adhesives depends on several factors, including the ramp up and ramp down rate of the particular autoclave device, and the particular type of adhesives used in the package structure. However, a satisfactory starting point may be the same process conditions used for the BOC type structure shown in FIG. 1, namely, 125 p.s.i. and 165° C. for 70 minutes.

The die 58 is subsequently electrically coupled to the respective lead fingers 56a and 56b through bond wires (not shown) bonded to the bond pads 60a–c and the respective lead fingers 56a and 56b. The LOC structure 50 will eventually be encapsulated in a plastic package to protect the die 58 from damage and to facilitate handling.

From the foregoing it will be appreciated that, although specific embodiments of the invention have been described herein for purposes of illustration, various modifications may be made without deviating from the spirit and scope of the invention. For example, curing processes according to principles of the present invention have been described with respect to a BOC and an LOC package structure. However, a curing process including both relatively high pressures and increased temperatures may be employed to cure adhesive materials in any type of package structure where the adhesive is used to affix a semiconductor die. Furthermore, as will be appreciated by one skilled in the art, each of the embodiments described previously may be performed on more than one assembly at a time to facilitate the mass production of packaged devices. Accordingly, the invention is not limited except as by the appended claims.

What is claimed is:

1. A method for curing an adhesive die attach material in a board-on-chip (BOC) and lead-on-chip (LOC) semiconductor device package assembly having a semiconductor die adhered to a substrate by the adhesive die attach material, the method comprising:

applying a bonding pressure to the semiconductor package assembly within a chamber, the bonding pressure of the chamber being greater than an exterior pressure; and simultaneous to the application of the bonding pressure to the semiconductor package assembly, applying heat having a temperature between 100° C. and 200° C. to the semiconductor package assembly for a period ranging from 30 minutes to 4 hours in order to cure the adhesive die attach material, wherein during the process of applying pressure and heat to the semiconductor package assembly, volatile diffuses through the adhesive die attach material.

2. The method of claim 1 wherein the pressure applied is between about 30 and 250 pounds per square inch.

3. The method of claim 1 wherein the pressure applied is between about 115 and 135 pounds per square inch.

4. The method of claim 1 wherein the pressure applied is about 125 pounds per square inch.

5. The method of claim 1 wherein the heat applied has a temperature between about 165° C. and 200° C.

6. The method of claim 1 wherein the heat applied has a temperature between about 140° C. and 175° C.

7. The method of claim 1 wherein the heat applied has a temperature about 165° C.

8. The method of claim 1 wherein the pressure and heat are applied for a length of time sufficient to allow the volatile to diffuse through the adhesive die attach material.

9. The method of claim 1 wherein the pressure and heat are applied for a length of time between 50 and 90 minutes.

10. The method of claim 1 wherein the pressure and heat are applied for approximately 70 minutes.

11. The method of claim 1 wherein the pressure applied is less than or approximately equal to 125 pounds per square inch and the heat applied is less than or approximately equal to 165° C., both simultaneously for greater than or approximately 70 minutes.

12. A method of attaching a semiconductor die to a substrate in a board-on-chip (BOC) and lead-on-chip (LOC) semiconductor device package assembly, the method comprising:

adhering the semiconductor die to the substrate using an adhesive die attach material disposed between a surface of the die and substrate in order to form a package assembly; and reducing voids in a die attach bondline defined by the interface between the adhesive die attach material and the surface of the die by applying a process comprising:

applying a bonding pressure less than or approximately equal to 125 pounds per square inch to the semiconductor die and the substrate for greater than or approximately 70 minutes within a chamber, the bonding pressure of the chamber being greater than an exterior pressure; and simultaneous to the application of the bonding pressure to the semiconductor package assembly, curing the adhesive die attach material by applying heat having a temperature less than or approximately equal to 165° C. to the package assembly for greater than or approximately 70 minutes, wherein during the heating process volatile diffuses through the adhesive die attach material.

13. The method of claim 12 wherein the bonding pressure and heat are applied to the package assembly simultaneously for a length of time between 70 minutes and 4 hours.

14. The method of claim 12 wherein the bonding pressure and heat are applied to the package assembly simultaneously for a length of time between 70 and 90 minutes.

15. The method of claim 12 wherein the bonding pressure and heat are applied to the package assembly simultaneously, and the pressure applied is between about 30 and 125 pounds per square inch.

16. The method of claim 12 wherein the bonding pressure and heat are applied to the package assembly simultaneously, and the pressure applied is between about 100 and 125 pounds per square inch.

17. The method of claim 12 wherein the bonding pressure and heat are applied to the package assembly simultaneously, and the applied heat has a temperature between about 100° C. and 165° C.

18. The method of claim 12 wherein the bonding pressure and heat are applied to the package assembly simultaneously, and the applied heat has a temperature between about 140° C. and 165° C.

19. The method of claim 12 wherein the bonding pressure and heat are applied to the package assembly for a length of time sufficient to allow the volatile to diffuse through the adhesive die attach material.

20. The method of claim 12, further comprising electrically coupling the semiconductor die to conductive traces formed on the surface of the substrate through conductive bond wires.

* * * * *

UNITED STATES PATENT AND TRADEMARK OFFICE
CERTIFICATE OF CORRECTION

PATENT NO.      : 6,524,891 B1                                                  Page 1 of 1
DATED           : February 25, 2003
INVENTOR(S)     : Tongbi Jiang It is certified that error appears in the above-identified patent and that said Letters Patent is hereby corrected as shown below:

Column 2,
Line 5, "die involved attaching" should read -- die involve attaching --

Column 4,
Line 13, "sives is cured" should read -- sive is cured --
Line 16, "are provided. as a" should read -- are provided as a --

Column 5,
Line 26, "in FIG. 3. That is" should read -- in FIG. 3; that is, --

Column 6,
Line 7, "bonding pressure to the semiconductor" should read -- bonding pressure in between about 115 and 135 pounds per square inch to the semiconductor --
Line 18, "volatile diffuses" should read -- volatile material diffuses --

Signed and Sealed this

Eleventh Day of May, 2004

JON W. DUDAS
*Acting Director of the United States Patent and Trademark Office*